US 8,435,351 B2

(12) United States Patent
Vukovic (10) Patent No.: US 8,435,351 B2
(45) Date of Patent: May 7, 2013

(54) METHOD AND SYSTEM FOR MEASURING A FLOW RATE IN A SOLID PRECURSOR DELIVERY SYSTEM

(75) Inventor: Mirko Vukovic, Slingerlands, NY (US)

(73) Assignee: Tokyo Electron Limited, Tokyo (JP)

( * ) Notice: Subject to any disclaimer, the term of this patent is extended or adjusted under 35 U.S.C. 154(b) by 631 days.

(21) Appl. No.: 10/998,393

(22) Filed: Nov. 29, 2004

(65) Prior Publication Data

US 2006/0115589 A1  Jun. 1, 2006

(51) Int. Cl.
*C23C 16/00* (2006.01)
*C23C 16/52* (2006.01)

(52) U.S. Cl.
USPC ...... 118/726; 73/31.06; 261/19; 261/DIG. 65

(58) Field of Classification Search .......... 118/726; 117/200
See application file for complete search history.

(56) References Cited

U.S. PATENT DOCUMENTS

| | | | |
|---|---|---|---|
| 5,914,001 A | 6/1999 | Hansen | 156/345 |
| RE36,295 E * | 9/1999 | Smith et al. | 117/200 |
| 6,099,649 A * | 8/2000 | Schmitt et al. | 118/715 |
| 6,119,710 A * | 9/2000 | Brown | 137/14 |
| 6,461,436 B1 * | 10/2002 | Campbell et al. | 118/715 |
| 6,544,345 B1 | 4/2003 | Mayer et al. | 134/28 |
| 2002/0023831 A1 * | 2/2002 | Iwase et al. | 204/192.12 |
| 2003/0072875 A1 * | 4/2003 | Sandhu | 427/248.1 |
| 2003/0094136 A1 * | 5/2003 | Bartholomew et al. | 118/715 |
| 2003/0143328 A1 * | 7/2003 | Chen et al. | 427/255.28 |
| 2004/0165870 A1 | 8/2004 | Sandhu | |
| 2005/0081882 A1 * | 4/2005 | Greer et al. | 134/1.1 |

FOREIGN PATENT DOCUMENTS

| | | |
|---|---|---|
| GB | 1140411 | 1/1969 |
| JP | 09-162132 | 6/1997 |
| JP | 2002-367911 | * 12/2002 |
| JP | 2002367911 | 12/2002 |

OTHER PUBLICATIONS

European Patent Office, International Search Report and Written Opinion, Aug. 8, 2006, 11 pg.
State Intellectual Property Office of the People'S Republic of China, First Office Action received in related Chinese Patent Application No. 200580040913.5 dated Feb. 6, 2009, 7 pp.
State Intellectual Property Office of the People'S Republic of China, Second Office Action received in related Chinese Patent Application No. 200580040913.5 dated Sep. 25, 2009, 9 pp.
Japan Patent Office, Office Action issued in corresponding JP Application No. 2007-534037 mailed Aug. 30, 2011, 7 pp.
Korean Intellectual Property Office, translation of Office Action issued in corresponding Korean Patent Application No. 10-2007-7009162, dated Aug. 1, 2012, 5 pp.

* cited by examiner

*Primary Examiner* — Parviz Hassanzadeh
*Assistant Examiner* — Nathan K Ford
(74) *Attorney, Agent, or Firm* — Wood, Herron & Evans, LLP (57) ABSTRACT

Improved measurement accuracy for determining the flow rate of precursor vapor to the deposition tool, particularly for use with low vapor pressure precursors, such as ruthenium carbonyl ($Ru_3(CO)_{12}$) or rhenium carbonyl ($Re_2(CO)_{10}$). In one embodiment, the system includes a differential pressure manometer is provided for measuring the flow rate. A method of measurement and calibration is also provided.

22 Claims, 4 Drawing Sheets

METHOD AND SYSTEM FOR MEASURING A FLOW RATE IN A SOLID PRECURSOR DELIVERY SYSTEM

BACKGROUND OF THE INVENTION

1. Field of the Invention

The present invention relates to a method and system for thin film deposition, and more particularly to a method and system for measuring the flow rate of a metal precursor vapor derived from a solid metal precursor having a low vapor pressure.

2. Description of Related Art

The introduction of copper (Cu) metal into multilayer metallization schemes for manufacturing integrated circuits can necessitate the use of diffusion barriers/liners to promote adhesion and growth of the Cu layers and to prevent diffusion of Cu into the dielectric materials. Barriers/liners that are deposited onto dielectric materials can include refractive materials, such as tungsten (W), molybdenum (Mo), and tantalum (Ta), that are non-reactive and immiscible in Cu, and can offer low electrical resistivity. Current integration schemes that integrate Cu metallization and dielectric materials can require barrier/liner deposition processes at substrate temperatures between about 400° C. and about 500° C., or lower.

For example, Cu integration schemes for technology nodes less than or equal to 130 nm currently utilize a low dielectric constant (low-k) inter-level dielectric, followed by a physical vapor deposition (PVD) TaN layer and Ta barrier layer, followed by a PVD Cu seed layer, and an electrochemical deposition (ECD) Cu fill. Generally, Ta layers are chosen for their adhesion properties (i.e., their ability to adhere on low-k films), and Ta/TaN layers are generally chosen for their barrier properties (i.e., their ability to prevent Cu diffusion into the low-k film).

As described above, significant effort has been devoted to the study and implementation of thin transition metal layers as Cu diffusion barriers, these studies including such materials as chromium, tantalum, molybdenum and tungsten. Each of these materials exhibits low miscibility in Cu. More recently, other materials, such as ruthenium (Ru) and rhodium (Rh), have been identified as potential barrier layers since they are expected to behave similarly to conventional refractory metals. However, the use of Ru or Rh can permit the use of only one barrier layer, as opposed to two layers, such as Ta/TaN. This observation is due to the adhesive and barrier properties of these materials. For example, one Ru layer can replace the Ta/TaN barrier layer. Moreover, current research is finding that the one Ru layer can further replace the Cu seed layer, and bulk Cu fill can proceed directly following Ru deposition. This observation is due to good adhesion between the Cu and the Ru layers.

Conventionally, Ru layers can be formed by thermally decomposing a ruthenium-containing precursor, such as a ruthenium carbonyl precursor, in a thermal chemical vapor deposition (TCVD) process. Material properties of Ru layers that are deposited by thermal decomposition of metal-carbonyl precursors (e.g., $Ru_3(CO)_{12}$) can deteriorate when the substrate temperature is lowered to below about 400° C. As a result, an increase in the (electrical) resistivity of the Ru layers and poor surface morphology (e.g., the formation of nodules) at low deposition temperatures, has been attributed to increased incorporation of CO reaction by-products into the thermally deposited Ru layers. Both effects can be explained by a reduced CO desorption rate from the thermal decomposition of the ruthenium-carbonyl precursor at substrate temperatures below about 400° C.

Additionally, the use of metal-carbonyls, such as ruthenium carbonyl, can lead to poor deposition rates due to their low vapor pressure and the transport issues associated therewith. Overall, the inventor has observed that current deposition systems suffer from such a low rate, making the deposition of such metal films impractical.

Furthermore, the use of solid metal precursors, such as some of the metal-carbonyls identified above (i.e., ruthenium carbonyl and rhenium carbonyl), is less amenable to direct measurement of the mass flow rate of metal precursor vapor arising from sublimation of the solid metal precursor, thus causing inconsistencies in process performance from one substrate to the next. Moreover, the measurement of flow rate is further complicated by the very low vapor pressure of these materials at the temperatures utilized for evaporation, e.g., less than 10 mTorr.

SUMMARY OF THE INVENTION

In one embodiment of the present invention, a method and system is provided for measuring a flow parameter related to the flow rate of a metal precursor vapor.

In another embodiment of the present invention, a method and system is provided for measuring a flow parameter related to the flow rate of a metal precursor vapor following sublimation of a solid metal precursor.

In yet another embodiment of the present invention, a method and system is provided for measuring a flow parameter related to the flow rate of a metal precursor vapor using a differential pressure measurement system, wherein the differential pressure measurement system measures a difference between the pressure in a vapor delivery system configured to transport the metal precursor vapor from an evaporation system to a process chamber, and the pressure in a reference system.

According to yet another embodiment, a deposition system for forming a refractory metal film on a substrate is provided comprising: a process chamber having a substrate holder configured to support the substrate and heat the substrate, a vapor distribution system configured to introduce metal precursor vapor above the substrate, and a pumping system configured to evacuate the process chamber; a metal precursor evaporation system configured to evaporate a metal precursor and transport the metal precursor vapor in a carrier gas, wherein a first flow of the carrier gas is supplied to the metal precursor evaporation system from a carrier gas supply system coupled to the metal precursor evaporation system; a vapor delivery system having a first end coupled to an outlet of the metal precursor evaporation system and a second end coupled to an inlet of the vapor distribution system of the process chamber; and a flow measurement system coupled to the vapor delivery system and configured to measure a flow parameter related to an amount of the metal precursor vapor transported in the carrier gas, wherein the flow measurement system is configured to determine the flow parameter from measuring a difference in pressure between the first flow of the carrier gas through the vapor delivery system and a second flow of a reference gas through a reference gas line, and from measuring an absolute pressure in at least one of the vapor delivery system and the reference line.

According to yet another embodiment, a method for monitoring a deposition system configured to deposit a refractory metal film on a substrate is provided comprising: initiating a desired flow rate of a carrier gas through a vapor delivery system coupling a metal precursor evaporation system to a process chamber, wherein the carrier gas is for transporting a metal precursor vapor through the vapor delivery system; initiating a reference flow of a reference gas through a reference gas line coupled to the vapor delivery system via a differential pressure measurement system; adjusting the reference flow of the reference gas until a first differential pressure measured using the differential pressure measurement system reaches a target value; introducing the metal precursor vapor to the desired flow of the carrier gas; measuring a second differential pressure between the reference gas line and the vapor delivery system; measuring an absolute pressure in at least one of the vapor delivery system or the reference gas line; and determining a flow parameter related to a flow rate of the metal precursor vapor using the first differential pressure, the second differential pressure, the absolute pressure, and the desired flow rate of the carrier gas.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
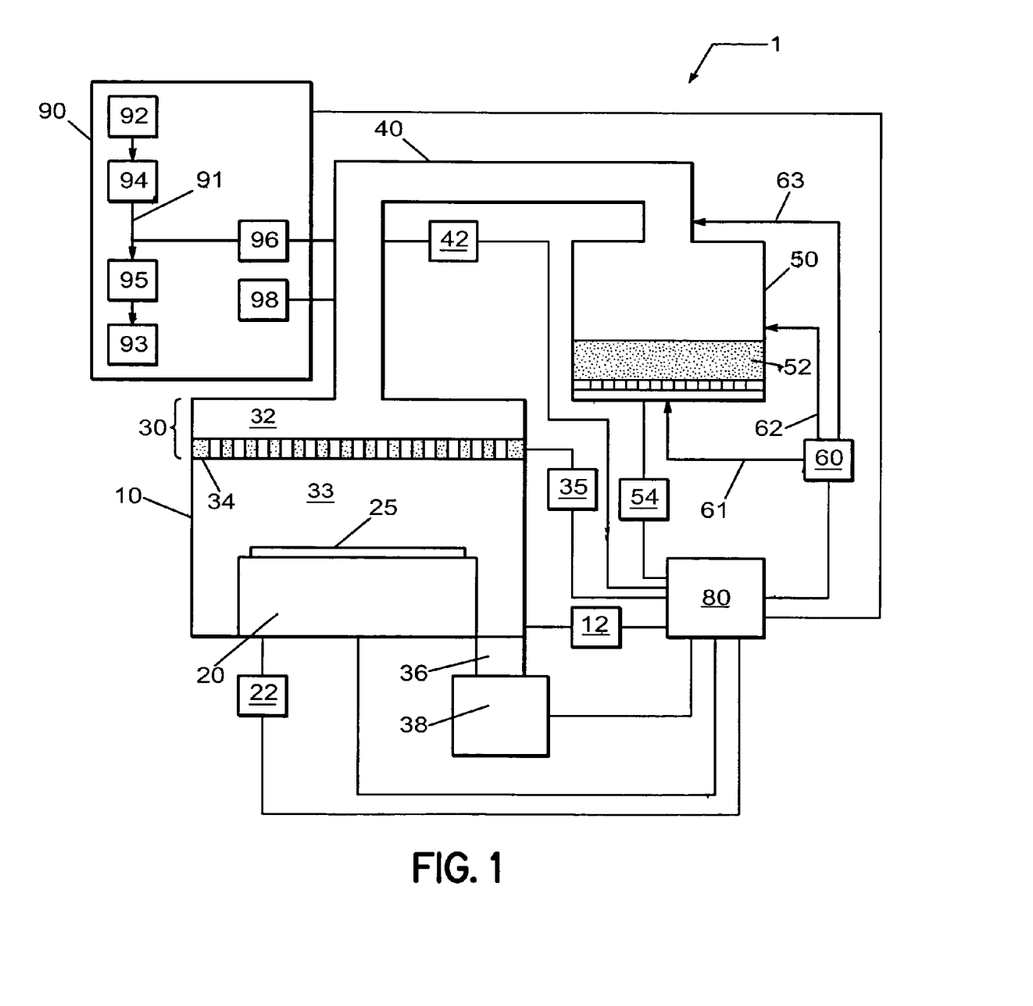
FIG. 1 depicts a schematic view of a deposition system according to an embodiment of the invention.

Referring now to the drawings, wherein like reference numerals designate identical or corresponding parts throughout the several views, FIG. 1 illustrates a deposition system 1 for depositing a metal film, such as a ruthenium (Ru) or a rhenium (Re) film, on a substrate according to one embodiment. The deposition system 1 comprises a process chamber 10 having a substrate holder 20 configured to support a substrate 25, upon which the metal film is formed. The process chamber 10 is coupled to a metal precursor evaporation system 50 via a vapor precursor delivery system 40.

The process chamber 10 is further coupled to a vacuum pumping system 38 through a duct 36, wherein the pumping system 38 is configured to evacuate the process chamber 10, vapor precursor delivery system 40, and metal precursor evaporation system 50 to a pressure suitable for forming the metal film on substrate 25, and suitable for evaporation of the metal precursor 52 in the metal precursor evaporation system 50.

Referring still to FIG. 1, the metal precursor evaporation system 50 is configured to store a metal precursor 52, and heat the metal precursor 52 to a temperature sufficient for evaporating the metal precursor 52, while introducing vapor phase metal precursor to the vapor precursor delivery system 40. The metal precursor 52 can, for example, comprise a solid metal precursor. Additionally, for example, the metal precursor can include a metal-carbonyl. For instance, the metal-carbonyl can include ruthenium carbonyl ($Ru_3(CO)_{12}$), or rhenium carbonyl ($Re_2(CO)_{10}$). Additionally, for instance, the metal-carbonyl can include $W(CO)_6$, $Mo(CO)_6$, $Co_2(CO)_8$, $Rh_4(CO)_{12}$, $Cr(CO)_6$, or $Os_3(CO)_{12}$.

In order to achieve the desired temperature for evaporating the metal precursor 52 (or subliming the solid metal precursor), the metal precursor evaporation system 50 is coupled to an evaporation temperature control system 54 configured to control the evaporation temperature. For instance, the temperature of the metal precursor 52 is generally elevated to approximately 40-45° C. in conventional systems in order to sublime the ruthenium carbonyl. At this temperature, the vapor pressure of the ruthenium carbonyl, for instance, ranges from approximately 1 to approximately 3 mTorr. As the metal precursor is heated to cause evaporation (or sublimation), a carrier gas can be passed over the metal precursor, by the metal precursor, or through the metal precursor, or any combination thereof. The carrier gas can include, for example, an inert gas, such as a noble gas (i.e., He, Ne, Ar, Kr, Xe), or a monoxide, such as CO, for use with metal-carbonyls, or a mixture thereof. For example, a carrier gas supply system 60 is coupled to the metal precursor evaporation system 50, and it is configured to, for instance, supply the carrier gas beneath the metal precursor 52 via feed line 61, or above the metal precursor 52 via feed line 62. In another example, carrier gas supply system 60 is coupled to the vapor precursor delivery system 40 and is configured to supply the carrier gas to the vapor of the metal precursor 52 via feed line 63 as or after it enters the vapor precursor delivery system 40. Although not shown, the carrier gas supply system 60 can comprise a gas source, one or more control valves, one or more filters, and a mass flow controller. For instance, the flow rate of carrier gas can range from approximately 5 sccm (standard cubic centimeters per minute) to approximately 1000 sccm. For example, the flow rate of carrier gas can range from about 10 sccm to about 200 sccm. By way of further example, the flow rate of carrier gas can range from about 20 sccm to about 100 sccm.

Downstream from the metal precursor evaporation system 50, the metal precursor vapor flows with the carrier gas through the vapor precursor delivery system 40 until it enters a vapor distribution system 30 coupled to the process chamber 10. The vapor precursor delivery system 40 can be coupled to a vapor line temperature control system 42 in order to control the vapor line temperature and prevent decomposition of the metal precursor vapor as well as condensation of the metal precursor vapor. For example, the vapor line temperature can be set to a value approximately equal to or greater than the evaporation temperature. Additionally, for example, the vapor precursor delivery system 40 can be characterized by a high conductance in excess of about 50 liters/second.

Referring again to FIG. 1, the vapor distribution system 30, coupled to the process chamber 10, comprises a vapor distribution plenum 32 within which the vapor disperses prior to passing through a vapor distribution plate 34 and entering a processing zone 33 above substrate 25. In addition, the vapor distribution plate 34 can be coupled to a distribution plate temperature control system 35 configured to control the temperature of the vapor distribution plate 34. For example, the temperature of the vapor distribution plate can be set to a value approximately equal to the vapor line temperature. However, it may be less, or it may be greater.

Once metal precursor vapor enters the processing zone 33, the metal precursor vapor thermally decomposes upon adsorption at the substrate surface due to the elevated temperature of the substrate 25, and the metal film is formed on the substrate 25. The substrate holder 20 is configured to elevate the temperature of substrate 25, by virtue of the substrate holder 20 being coupled to a substrate temperature control system 22. For example, the substrate temperature control system 22 can be configured to elevate the temperature of substrate 25 up to approximately 500° C. In one embodiment, the substrate temperature can range from about 100° C. to about 500° C. In another embodiment, the substrate temperature can range from about 300° C. to about 400° C. Additionally, process chamber 10 can be coupled to a chamber temperature control system 12 configured to control the temperature of the chamber walls.

As described above, for example, conventional systems have contemplated operating the metal precursor evaporation system 50, as well as the vapor precursor delivery system 40, within a temperature range of approximately 40-45° C. for ruthenium carbonyl in order to limit metal vapor precursor decomposition and metal vapor precursor condensation. For example, ruthenium carbonyl precursor can decompose at elevated temperatures to form by-products, such as those illustrated below:

$$Ru_3(CO)_{12}*(ad) \Leftrightarrow Ru_3(CO)_x*(ad)+(12-x)CO(g) \qquad (1)$$

or, $$Ru_3(CO)_x*(ad) \Leftrightarrow 3Ru(s)+xCO(g) \qquad (2)$$

wherein these by-products can adsorb (ad), i.e., condense, on the interior surfaces of the deposition system[1]. The accumulation of material on these surfaces can cause problems from one substrate to the next, such as process repeatability. Alternatively, for example, ruthenium carbonyl precursor can condense at depressed temperatures to cause recrystallization, viz.

$$Ru_3(Co)_{12}(g) \Leftrightarrow Ru_3(CO)_{12}*(ad) \qquad (3).$$

However, within such systems having a small process window, the deposition rate becomes extremely low, due in part to the low vapor pressure of ruthenium carbonyl. For instance, the deposition rate can be as low as approximately 1 Angstrom per minute. Therefore, according to one embodiment, the evaporation temperature is elevated to be greater than or equal to approximately 40° C. Alternatively, the evaporation temperature is elevated to be greater than or equal to approximately 50° C. In an exemplary embodiment of the present invention, the evaporation temperature is elevated to be greater than or equal to approximately 60° C. In a further exemplary embodiment, the evaporation temperature is elevated to range from approximately 60-100° C., for example from approximately 60-90° C. The elevated temperature increases the evaporation rate due to the higher vapor pressure (e.g., nearly an order of magnitude larger) and, hence, it is expected by the inventors to increase the deposition rate. However, it may now be desirable to periodically clean deposition system 1 following one or more substrates. For example, additional details can be obtained from co-pending U.S. Patent Application No. 10/998,394, filed on even date herewith and entitled "Method and System for Performing In-situ Cleaning of a Deposition System," which is herein incorporated by reference in its entirety.

As discussed above, the deposition rate is proportional to the amount of metal precursor that is evaporated and transported to the substrate prior to decomposition or condensation, or both. Therefore, in order to achieve a desired deposition rate and maintain consistent processing performance (i.e., deposition rate, film thickness, film uniformity, film morphology, etc.) from one substrate to the next, it is important to provide the ability to monitor, adjust, or control the flow rate of the metal precursor vapor. In conventional systems, an operator may indirectly determine the flow rate of metal precursor vapor by using the evaporation temperature and a pre-determined relationship between the evaporation temperature and the flow rate. However, processes and their performance drift in time, and hence it is imperative that the flow rate is measured more accurately.

Referring still to FIG. 1, a flow rate measurement system 90 for measuring the flow rate of metal precursor vapor is illustrated according to one embodiment. A reference gas line 91, providing a flow of reference gas from a gas source 92, such as an inert gas source, to a vent 93, is coupled to the vapor delivery system 40 via a differential pressure measurement system 96. The reference gas line 91 can further include a reference gas mass flow controller 94 configured to measure and control the flow rate of reference gas through the reference gas line 91, and a flow restrictor 95 configured to provide sufficient flow restriction to permit reasonably low, but measurable, flow rates of reference gas, while still achieving a reference pressure suitable for performing a differential pressure measurement between the reference gas line and the vapor delivery system 40.

For example, the gas source 92 can include an independent gas source configured to flow an inert gas, such as a noble gas (i.e., argon) or nitrogen, or any other gas. Alternatively, the gas source 92 may include the carrier gas supply system 60, as described above and shown in FIG. 1. Furthermore, the vent 93 can include a pumping system, such as a vacuum pumping system, configured to release the reference gas to atmosphere. Alternatively, the vent 93 may include coupling the output of reference gas line 91 to the duct 36 shown in FIG. 1.

As illustrated in FIG. 1, the differential pressure measurement system 96 is configured to measure the difference in pressure between the reference pressure in the reference gas line 91 and the local pressure in the vapor delivery system 40. For example, the differential pressure measurement system 96 can include a differential pressure capacitance manometer. Furthermore, as illustrated in FIG. 1, the flow rate measurement system 90 can include an absolute pressure measurement system 98 configured to measure the (absolute) local pressure in the vapor delivery system 40. For example, the differential pressure measurement system 96 can include a differential pressure capacitance manometer, such as model no. 698A differential pressure manometer (having a pressure range of 0.1 mmHg), or a model no. 616A differential pressure manometer (having a pressure range of 1 mmHg), commercially available from MKS Instruments, Inc.

According to one embodiment, the flow rate of metal precursor vapor can be measured using the following procedure. The carrier gas, utilized to transport the metal precursor vapor from the metal precursor evaporation system 50 to the process chamber 10 through the vapor delivery system 40, can be set to a desired flow rate characteristic of the flow rate to be used in the forthcoming deposition process. Thereafter, the flow of reference gas can be initiated, and the flow rate of the reference gas can be adjusted to determine a matching flow rate wherein the differential pressure measurement system 96 reaches a target differential pressure, such as a value of zero. Once the matching flow rate is determined and while maintaining this matching flow rate, the introduction of metal precursor vapor can begin, such that the flow of gas through the vapor delivery system 40 now includes both the flow of carrier gas at the desired flow rate and an unknown flow rate of metal precursor vapor. At this time, the differential pressure can be measured using the differential pressure measurement system 96, and the (absolute) local pressure can be measured using the absolute pressure measurement system 98.

The ratio of the measured differential pressure and the absolute pressure is the partial pressure of the metal precursor vapor, assuming the predominant specie(s) (outside of that of the carrier gas) in the flow of gas to the process chamber to be the (non-decomposed) metal precursor vapor, i.e., $Ru_3(CO)_{12}$ (g), or $Re_2(CO)_{10}$ (g). Given the partial pressure, the mole fraction is directly determined, viz.

$$\frac{\Delta P}{P} = \frac{p_a}{P} = \frac{n_a}{n_a + n_b} = \frac{\dot{n}_a}{\dot{n}_a + \dot{n}_b}, \quad (4)$$

where $\Delta P$ represents the differential pressure, P represents the absolute pressure, $p_a$ is the partial pressure of species "a" (such as the partial pressure of metal precursor vapor), $n_a$ is the number of moles of specie "a", $n_b$ is the number of moles of specie "b" (i.e., the carrier gas), $\dot{n}_a$ is the molar flow rate of specie "a", and $\dot{n}_b$ is the molar flow rate of specie "b". From the measurement of the differential pressure and the absolute pressure, and the known flow rate of carrier gas (i.e., $\dot{m}_b = MW_b \dot{n}_b$, where $MW_b$ is the molecular weight of specie "b"), the molar flow rate and, hence, mass flow rate of the metal precursor vapor (i.e., $\dot{m}_a = MW_a \dot{n}_a$, where $MW_a$ is the molecular weight of specie "a") can be determined.

Still referring the FIG. 1, the deposition system 1 can further include a control system 80 configured to operate and control the operation of the deposition system 1. The control system 80 is coupled to the process chamber 10, the substrate holder 20, the substrate temperature control system 22, the chamber temperature control system 12, the vapor distribution system 30, the vapor precursor delivery system 40, the metal precursor evaporation system 50, and the carrier gas supply system 60.

Figure 2:
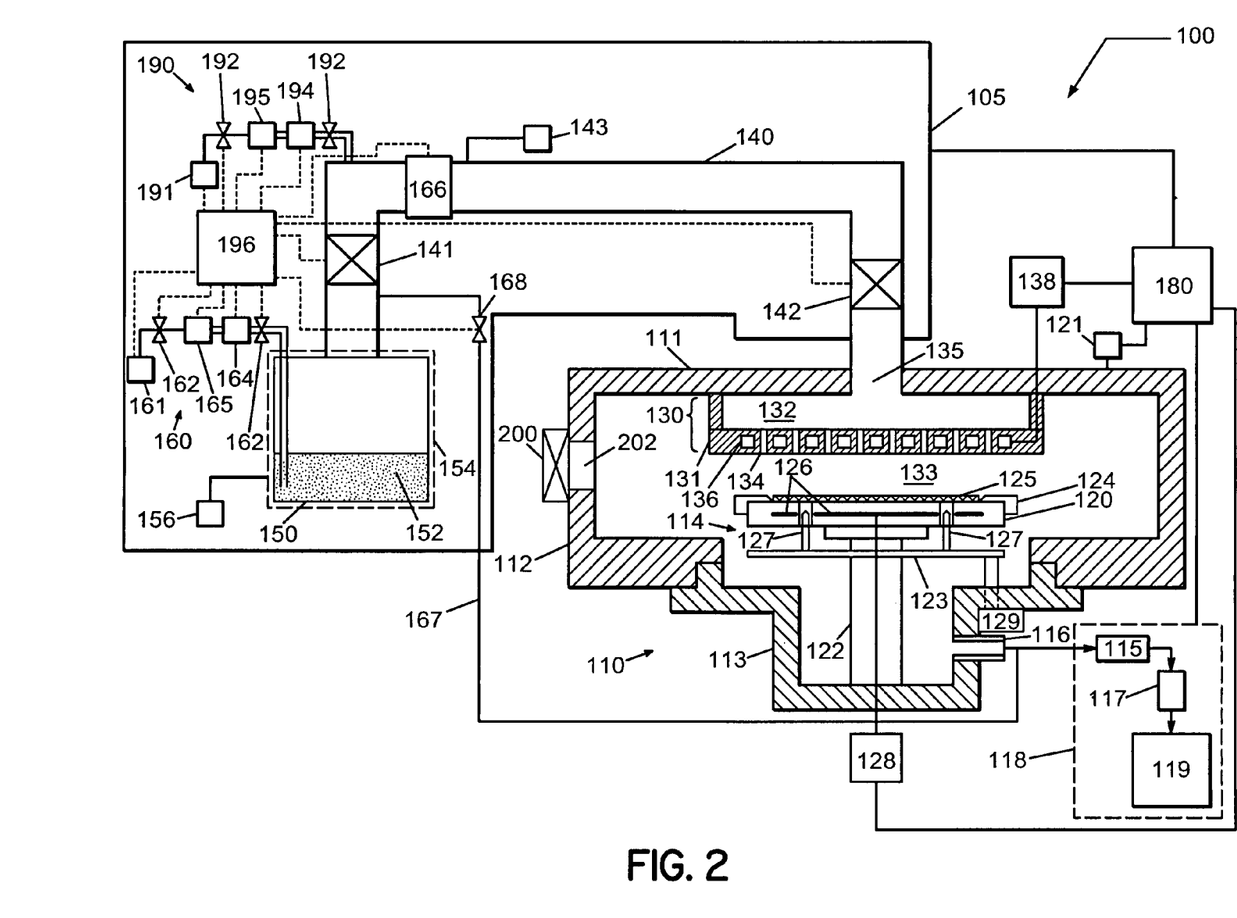
FIG. 2 depicts a schematic view of a deposition system according to another embodiment of the invention.

In yet another embodiment, FIG. 2 illustrates a deposition system 100 for depositing a metal film, such as a ruthenium (Ru) or a rhenium (Re) film, on a substrate. The deposition system 100 comprises a process chamber having a substrate holder 120 configured to support a substrate 125, upon which the metal film is formed. The process chamber 110 is coupled to a precursor delivery system 105 having metal precursor evaporation system 150 configured to store and evaporate a metal precursor 152, and a vapor precursor delivery system 140 configured to transport the metal precursor 152.

The process chamber 110 comprises an upper chamber section 111, a lower chamber section 112, and an exhaust chamber 113. An opening 114 is formed within lower chamber section 112, where bottom section 112 couples with exhaust chamber 113.

Referring still to FIG. 2, substrate holder 120 provides a horizontal surface to support substrate (or wafer) 125, which is to be processed. The substrate holder 120 can be supported by a cylindrical support member 122, which extends upward from the lower portion of exhaust chamber 113. An optional guide ring 124 for positioning the substrate 125 on the substrate holder 120 is provided on the edge of substrate holder 120. Furthermore, the substrate holder 120 comprises a heater 126 coupled to substrate holder temperature control system 128. The heater 126 can, for example, include one or more resistive heating elements. Alternately, the heater 126 can, for example, include a radiant heating system, such as a tungsten-halogen lamp. The substrate holder temperature control system 128 can include a power source for providing power to the one or more heating elements, one or more temperature sensors for measuring the substrate temperature or the substrate holder temperature, or both, and a controller configured to perform at least one of monitoring, adjusting, or controlling the temperature of the substrate or substrate holder.

During processing, the heated substrate 125 can thermally decompose a vapor of metal-carbonyl precursor 152, and enable deposition of a metal layer on the substrate 125. According to one embodiment, the metal precursor includes a solid metal precursor. According to another embodiment, the metal precursor includes a metal-carbonyl precursor. According to yet another embodiment, the metal precursor 152 can be a ruthenium-carbonyl precursor, for example $Ru_3(CO)_{12}$. According to yet another embodiment of the invention, the metal precursor 152 can be a rhenium carbonyl precursor, for example $Re_2(CO)_{10}$. As will be appreciated by those skilled in the art of thermal chemical vapor deposition, other ruthenium carbonyl precursors and rhenium carbonyl precursors can be used without departing from the scope of the invention. In yet another embodiment, the metal precursor 152 can be $W(CO)_6$, $Mo(CO)_6$, $Co_2(CO)_8$, $Rh_4(CO)_{12}$, $Cr(CO)_6$, or $Os_3(CO)_{12}$, or the like. The substrate holder 120 is heated to a pre-determined temperature that is suitable for depositing the desired Ru, Re or other metal layer onto the substrate 125. Additionally, a heater (not shown), coupled to a chamber temperature control system 121, can be embedded in the walls of process chamber 110 to heat the chamber walls to a pre-determined temperature. The heater can maintain the temperature of the walls of process chamber 110 from about 40° C. to about 100° C., for example from about 40° C. to about 80° C. A pressure gauge (not shown) is used to measure the process chamber pressure.

Also shown in FIG. 2, a vapor distribution system 130 is coupled to the upper chamber section 111 of process chamber 110. Vapor distribution system 130 comprises a vapor distribution plate 131 configured to introduce precursor vapor from vapor distribution plenum 132 to a processing zone 133 above substrate 125 through one or more orifices 134.

Furthermore, an opening 135 is provided in the upper chamber section 111 for introducing a vapor precursor from vapor precursor delivery system 140 into vapor distribution plenum 132. Moreover, temperature control elements 136, such as concentric fluid channels configured to flow a cooled or heated fluid, are provided for controlling the temperature of the vapor distribution system 130, and thereby prevent the decomposition of the metal precursor inside the vapor distribution system 130. For instance, a fluid, such as water, can be supplied to the fluid channels from a vapor distribution temperature control system 138. The vapor distribution temperature control system 138 can include a fluid source, a heat exchanger, one or more temperature sensors for measuring the fluid temperature or vapor distribution plate temperature or both, and a controller configured to control the temperature of the vapor distribution plate 131 from about 20° C. to about 100° C.

As illustrated in FIG. 2, a metal precursor evaporation system 150 is configured to hold a metal precursor 152 and evaporate (or sublime) the metal precursor 152 by elevating the temperature of the metal precursor. A precursor heater 154 is provided for heating the metal precursor 152 to maintain the metal precursor 152 at a temperature that produces a desired vapor pressure of metal precursor 152. The precursor heater 154 is coupled to an evaporation temperature control system 156 configured to control the temperature of the metal precursor 152. For example, the precursor heater 154 can be configured to adjust the temperature of the metal precursor 152 (or evaporation temperature) to be greater than or equal to approximately 40° C. Alternatively, the evaporation temperature is elevated to be greater than or equal to approximately 50° C. For example, the evaporation temperature is elevated to be greater than or equal to approximately 60° C. In one embodiment, the evaporation temperature is elevated to range from approximately 60-100° C., and in another embodiment, to range from approximately 60-90° C.

As the metal precursor 152 is heated to cause evaporation (or sublimation), a carrier gas can be passed over the metal precursor, by the metal precursor, or through the metal precursor, or any combination thereof. The carrier gas can include, for example, an inert gas, such as a noble gas (i.e., He, Ne, Ar, Kr, Xe), or a monoxide, such as CO, for use with metal-carbonyls, or a mixture thereof. For example, a carrier gas supply system 160 is coupled to the metal precursor evaporation system 150, and it is configured to, for instance, supply the carrier gas beneath the metal precursor, or above the metal precursor. Although not shown in FIG. 2, carrier gas supply system 160 can also or alternatively be coupled to the vapor precursor delivery system 140 to supply the carrier gas to the vapor of the metal precursor 152 as or after it enters the vapor precursor delivery system 140. The carrier gas supply system 160 can comprise a gas source 161, one or more control valves 162, one or more filters 164, and a mass flow controller 165. For instance, the flow rate of carrier gas can range from approximately 5 sccm (standard cubic centimeters per minute) to approximately 1000 sccm. In one embodiment, the flow rate of carrier gas can range from about 10 sccm to about 200 sccm. In another embodiment, the flow rate of carrier gas can range from about 20 sccm to about 100 sccm.

Additionally, a sensor 166 is provided for measuring the total gas flow from the metal precursor evaporation system 150. The sensor 166 can, for example, comprise a mass flow controller, and the amount of metal precursor delivered to the process chamber 110 can be determined using sensor 166 and mass flow controller 165. For example, sensor 166 can include a flow measurement system, as described above with reference to FIG. 1, comprising a reference gas line having a reference gas source, a vent, one or more flow controllers, and a flow restrictor, wherein the reference gas line is coupled to the vapor delivery system 140 via a differential pressure measurement system. Additionally, the flow measurement system can include an absolute pressure measurement system coupled to the vapor delivery system 140. As described above, a flow parameter related to the amount of metal precursor vapor flowing with a carrier gas can be determined using the flow measurement system.

A bypass line 167 can be located downstream from sensor 166, and it can connect the vapor delivery system 140 to an exhaust line 116. Bypass line 167 is provided for evacuating the vapor precursor delivery system 140, and for stabilizing the supply of the metal precursor to the process chamber 110. In addition, a bypass valve 168, located downstream from the branching of the vapor precursor delivery system 140, is provided on bypass line 167.

Referring still to FIG. 2, the vapor precursor delivery system 140 comprises a high conductance vapor line having first and second valves 141 and 142 respectively. Additionally, the vapor precursor delivery system 140 can further comprise a vapor line temperature control system 143 configured to heat the vapor precursor delivery system 140 via heaters (not shown). The temperatures of the vapor lines can be controlled to avoid condensation of the metal precursor in the vapor line. The temperature of the vapor lines can be greater than or equal to 40° C. Additionally, the temperature of the vapor lines can be controlled from about 40° C. to about 100° C., or from about 40° C. to about 90° C. For example, the vapor line temperature can be set to a value approximately equal to or greater than the evaporation temperature.

Moreover, dilution gases can be supplied from a dilution gas supply system 190. The dilution gas can include, for example, an inert gas, such as a noble gas (i.e., He, Ne, Ar, Kr, Xe), or a monoxide, such as CO, for use with metal-carbonyls, or a mixture thereof. For example, the dilution gas supply system 190 is coupled to the vapor precursor delivery system 140, and it is configured to, for instance, supply the dilution gas to vapor metal precursor. The dilution gas supply system 190 can comprise a gas source 191, one or more control valves 192, one or more filters 194, and a mass flow controller 195. For instance, the flow rate of carrier gas can range from approximately 5 sccm (standard cubic centimeters per minute) to approximately 1000 sccm.

Mass flow controllers 165 and 195, and valves 162, 192, 168, 141, and 142 are controlled by controller 196, which controls the supply, shutoff, and the flow of the carrier gas, the metal precursor vapor, and the dilution gas. Sensor 166 is also connected to controller 196 and, based on output of the sensor 166, controller 196 can control the carrier gas flow through mass flow controller 165 to obtain the desired metal precursor flow to the process chamber 110.

As illustrated in FIG. 2, the exhaust line 116 connects exhaust chamber 113 to pumping system 118. A vacuum pump 119 is used to evacuate process chamber 110 to the desired degree of vacuum, and to remove gaseous species from the process chamber 110 during processing. An automatic pressure controller (APC) 115 and a trap 117 can be used in series with the vacuum pump 119. The vacuum pump 119 can include a turbo-molecular pump (TMP) capable of a pumping speed up to 5000 liters per second (and greater). Alternately, the vacuum pump 119 can include a dry roughing pump. During processing, the carrier gas, dilution gas, or metal precursor vapor, or any combination thereof can be introduced into the process chamber 110, and the chamber pressure can be adjusted by the APC 115. For example, the chamber pressure can range from approximately 1 mTorr to approximately 500 mTorr, and in a further example, the chamber pressure can range from about 5 mTorr to 50 mTorr. The APC 115 can comprise a butterfly-type valve or a gate valve. The trap 117 can collect unreacted precursor material and by-products from the process chamber 110.

Referring back to the substrate holder 120 in the process chamber 110, as shown in FIG. 2, three substrate lift pins 127 (only two are shown) are provided for holding, raising, and lowering the substrate 125. The substrate lift pins 127 are coupled to plate 123, and can be lowered to below to the upper surface of substrate holder 120. A drive mechanism 129 utilizing, for example, an air cylinder provides means for raising and lowering the plate 123. Substrate 125 can be transferred into and out of process chamber 110 through gate valve 200 and chamber feed-through passage 202 via a robotic transfer system (not shown), and received by the substrate lift pins 127. Once the substrate 125 is received from the transfer system, it can be lowered to the upper surface of the substrate holder 120 by lowering the substrate lift pins 127.

Referring again to FIG. 2, a controller 180 includes a microprocessor, a memory, and a digital I/O port capable of generating control voltages sufficient to communicate and activate inputs of the processing system 100 as well as monitor outputs from the processing system 100. Moreover, the processing system controller 180 is coupled to and exchanges information with process chamber 110; precursor delivery system 105, which includes controller 196, vapor line temperature control system 143, and evaporation temperature control system 156; vapor distribution temperature control system 138; vacuum pumping system 118; and substrate holder temperature control system 128. In the vacuum pumping system 118, the controller 180 is coupled to and exchanges information with the automatic pressure controller 115 for controlling the pressure in the process chamber 110. A program stored in the memory is utilized to control the aforementioned components of deposition system 100 according to a stored process recipe. One example of processing system controller 180 is a DELL PRECISION WORKSTATION 610™, available from Dell Corporation, Dallas, Tex. The controller 180 may also be implemented as a general-purpose computer, digital signal process, etc.

Controller 180 may be locally located relative to the deposition system 100, or it may be remotely located relative to the deposition system 100 via an internet or intranet. Thus, controller 180 can exchange data with the deposition system 100 using at least one of a direct connection, an intranet, or the internet. Controller 180 may be coupled to an intranet at a customer site (i.e., a device maker, etc.), or coupled to an intranet at a vendor site (i.e., an equipment manufacturer). Furthermore, another computer (i.e., controller, server, etc.) can access controller 180 to exchange data via at least one of a direct connection, an intranet, or the internet.

As described above, for example, conventional systems have contemplated operating the metal precursor evaporation system, as well as the vapor precursor delivery system, within a temperature range of approximately 40-45° C. for ruthenium carbonyl in order to limit metal vapor precursor decomposition and metal vapor precursor condensation. However, due to the low vapor pressure of metal-carbonyls, such as ruthenium carbonyl or rhenium carbonyl, at this temperature, the deposition rate of, for example, ruthenium or rhenium, is very low. In order to improve the deposition rate, the evaporation temperature can be raised above about 40° C., for example above about 50° C. Following high temperature evaporation of the metal precursor for one or more substrates, the deposition system can be periodically cleaned to remove residues formed on interior surfaces of the deposition system.

Figure 3:
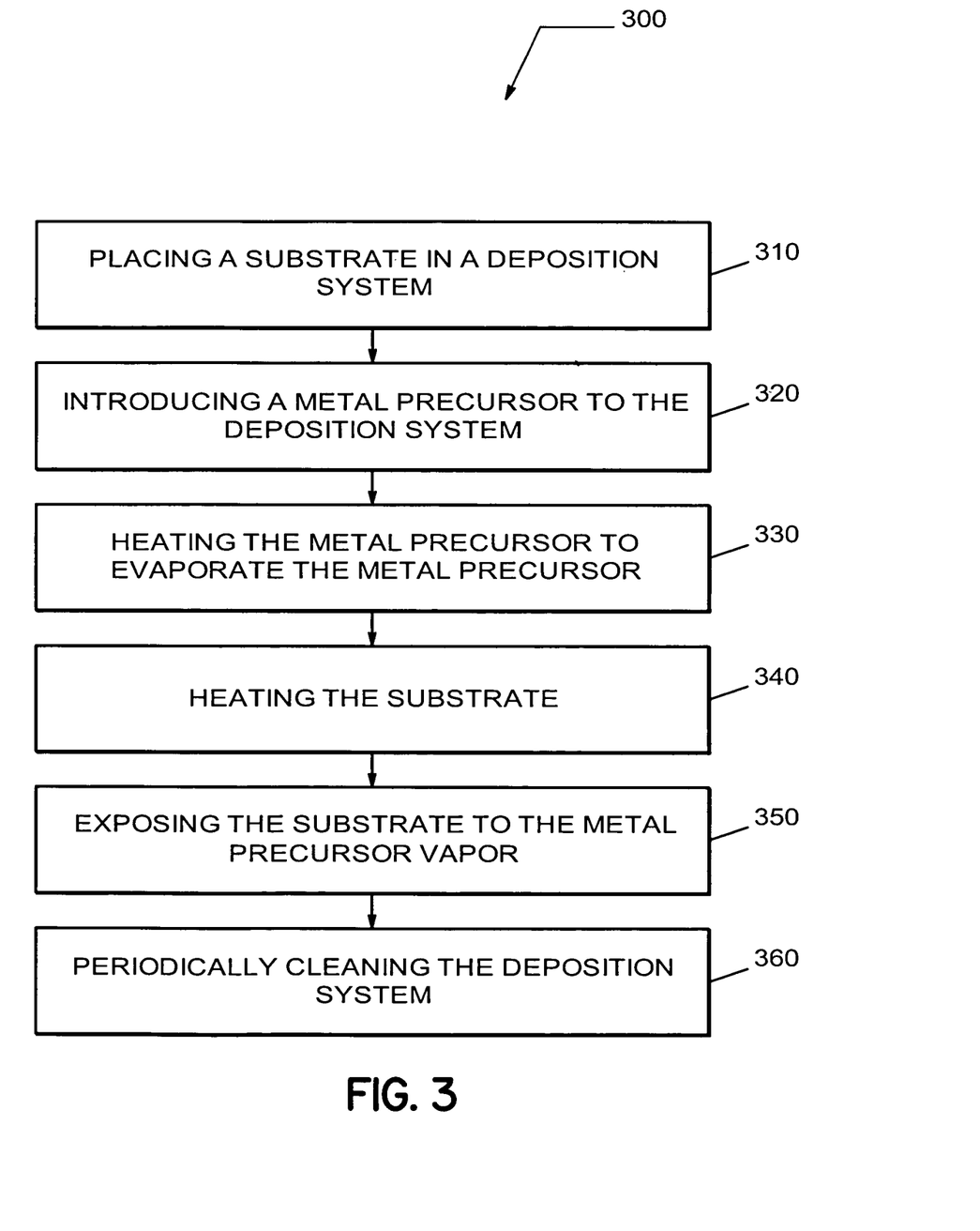
FIG. 3 illustrates a method of depositing a metal film on a substrate according to an embodiment of the invention.

Referring now to FIG. 3, a method of depositing a refractory metal film on a substrate is described. A flow chart 300 is used to illustrate the steps in depositing the metal film in a deposition system in accordance with the method of the present invention. The metal film deposition begins in 310 with placing a substrate in the deposition system for forming the metal film on the substrate. For example, the deposition system can include any one of the depositions systems described above in FIGS. 1 and 2. The deposition system can include a process chamber for facilitating the deposition process, and a substrate holder coupled to the process chamber and configured to support the substrate. Then, in 320, a metal precursor is introduced to the deposition system. For instance, the metal precursor is introduced to a metal precursor evaporation system coupled to the process chamber via a precursor vapor delivery system. Additionally, for instance, the vapor deliver system can be heated.

In 330, the metal precursor is heated to form a metal precursor vapor. The metal precursor vapor can then be transported to the process chamber through the precursor vapor delivery system. In 340, the substrate is heated to a substrate temperature sufficient to decompose the metal precursor vapor, and, in 350, the substrate is exposed to the metal precursor vapor. Steps 310 to 350 may be repeated successively a desired number of times to deposit a metal film on a desired number of substrates.

Following the deposition of the refractory metal film on one or more substrates, the deposition system can be periodically cleaned in 360 by introducing a cleaning composition from an in-situ cleaning system (not shown) coupled to the deposition system. The cleaning composition can, for example, include a halogen containing radical, fluorine radical, oxygen radical, ozone, or a combination thereof. The in-situ cleaning system can, for example, include a radical generator, or an ozone generator. When a cleaning process is performed, a "dummy" substrate can be utilized to protect the substrate holder. Furthermore, the metal precursor evaporation system, the precursor vapor delivery system, the process chamber, the vapor distribution system, or the substrate holder, or any combination thereof can be heated.

Figure 4:
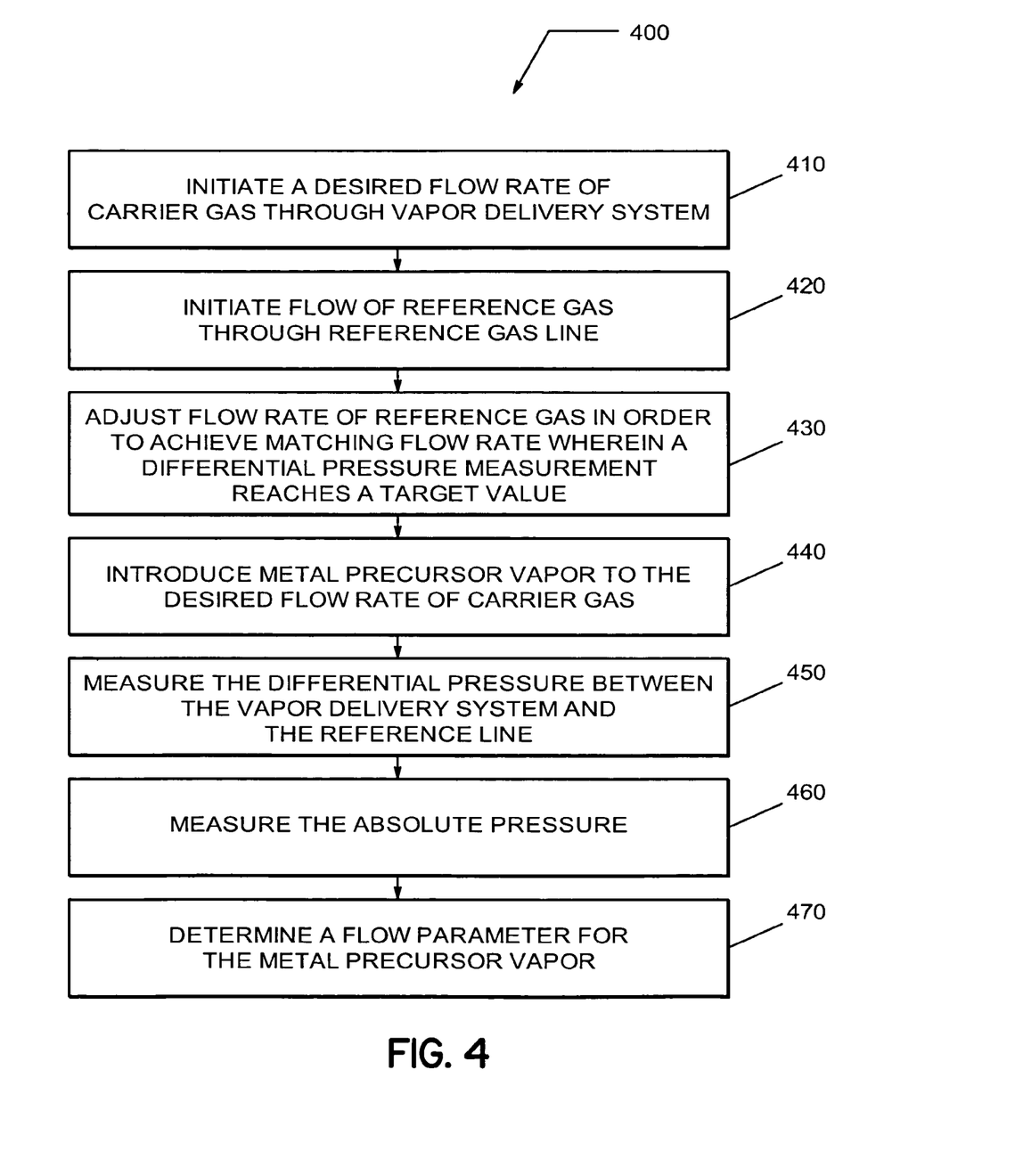
FIG. 4 illustrates a method of measuring a flow rate of a metal precursor vapor according to an embodiment of the invention.

Referring now to FIG. 4, a method of measuring the flow rate of a metal precursor vapor is described. The method of measuring the flow rate of metal precursor vapor can be utilized in a deposition system for depositing metal on a substrate such as one of the deposition systems described in FIGS. 1 and 2. The method is represented by a flow chart 400 beginning in 410 with initiating a desired flow rate of a carrier gas through the vapor delivery system. As described above, the carrier gas can include an inert gas, such as a noble gas, or a monoxide, such as carbon monoxide, or a mixture thereof. As shown in FIGS. 1 and 2, the carrier gas can be introduced from a carrier gas supply system.

In 420, a flow of a reference gas, such as an inert gas, is initiated through the reference gas line. Thereafter, in 430, the flow rate of the reference gas is adjusted in order to achieve a matching flow rate, wherein a differential pressure between the vapor delivery system and the reference line reaches a target value. For example, the target value can be a value of zero.

In 440, metal precursor vapor is introduced to the carrier gas flow from the metal precursor evaporation system. Then, in 450, the differential pressure between the vapor delivery system and the reference gas line is measured. In 460, the absolute pressure in the vapor delivery system is measured. Alternatively, the absolute pressure in the reference gas line is measured. In 470, a flow parameter for the metal precursor vapor is determined using the measurement of the absolute pressure and the differential pressure. For example, the flow parameter can include a mass flow rate, a molar flow rate, a number of moles, a mass, a mass fraction, a mole fraction, a partial pressure, or a concentration, or a combination thereof.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A deposition system for forming a refractory metal film on a substrate comprising:
    a process chamber having a substrate holder configured to support said substrate and heat said substrate, a vapor distribution system configured to introduce metal precursor vapor above said substrate, and a pumping system configured to evacuate said process chamber;
    a metal precursor evaporation system configured to evaporate a metal precursor;
    a vapor delivery system having a first end coupled to an outlet of said metal precursor evaporation system and a second end coupled to an inlet of said vapor distribution system of said process chamber;
    a carrier gas supply system coupled to at least one of said metal precursor evaporation system or said vapor delivery system, or both, and configured to supply a carrier gas at a first flow to transport said metal precursor vapor in said carrier gas to said inlet of said vapor distribution system;

a flow measurement system including a reference gas source coupled to a reference gas line and configured to supply a reference gas at a second flow through said reference gas line to a vent configured to exhaust said second flow; and a pressure measurement system including a differential pressure measurement system to measure a difference in pressure between said first flow of said carrier gas, with or without the said metal precursor vapor, through said vapor delivery system and said second flow of said reference gas through said reference gas line and to measure a flow parameter related to an amount of said metal precursor vapor when transported in said carrier gas, said vapor delivery system and said flow measurement system being fluidically coupled only by said differential pressure measurement system, and said differential pressure measurement system being downstream of said metal precursor evaporation system.

2. The deposition system of claim 1, wherein said pressure measurement system further includes an absolute pressure measurement system configured to measure an absolute pressure in at least one of said vapor delivery system and said flow measurement system.

3. The deposition system of claim 1, wherein said reference gas line further comprises a reference gas mass flow controller configured to adjust and control a flow rate of said second flow of said reference gas.

4. The deposition system of claim 1, wherein said flow parameter comprises a mass flow rate, a molar flow rate, a number of moles, a mass, a mass fraction, a mole fraction, a partial pressure, or a concentration.

5. The deposition system of claim 1, further comprising:
a controller coupled to said process chamber, said vapor delivery system, said metal precursor evaporation system, and said flow measurement system, and configured to perform at least one of setting, monitoring, adjusting, or controlling one or more of a substrate temperature, an evaporation temperature, a vapor line temperature, a flow rate of said carrier gas, a flow rate of said metal precursor vapor, or a pressure in said process chamber.

6. The deposition system of claim 1, wherein said metal precursor evaporation system is configured to evaporate a solid metal precursor.

7. The deposition system of claim 1, wherein said metal precursor evaporation system is configured to evaporate a metal-carbonyl precursor.

8. The deposition system of claim 1, wherein said carrier gas supply system is configured to supply an inert gas.

9. The deposition system of claim 1, wherein said vapor precursor delivery system is characterized by a high conductance in excess of about 50 liters/second.

10. A deposition system for forming a refractory metal film on a substrate comprising:
a process chamber having a substrate holder configured to support said substrate and heat said substrate, a vapor distribution system configured to introduce metal precursor vapor above said substrate, and a pumping system configured to evacuate said process chamber;
a metal precursor evaporation system configured to evaporate a metal precursor;
a vapor delivery system having a first end coupled to an outlet of said metal precursor evaporation system and a second end coupled to an inlet of said vapor distribution system of said process chamber;

a carrier gas supply system coupled to at least one of said metal precursor evaporation system or said vapor delivery system, or both, and configured to supply a carrier gas at a first flow to transport said metal precursor vapor in said carrier gas to said inlet of said vapor distribution system;

a flow measurement system including a reference gas line coupled between a reference gas source and an exhaust vent and configured to supply a reference gas at a second flow through said reference gas line to said exhaust vent; and a differential pressure measurement system configured to measure a flow parameter related to an amount of said metal precursor vapor transported in said carrier gas by measuring a difference in pressure between said first flow of said carrier gas through said vapor delivery system and said second flow of said reference gas through said reference gas line, said differential pressure measurement system being the only fluidic connection between said vapor delivery system and said flow measurement system, and said differential pressure measurement system being downstream of said metal precursor evaporation system.

11. The deposition system of claim 10, further comprising:
an absolute pressure measurement system configured to measure an absolute pressure in at least one of said vapor delivery system and said flow measurement system.

12. The deposition system of claim 10, wherein said reference gas line further comprises a reference gas mass flow controller configured to adjust and control a flow rate of said second flow of said reference gas.

13. The deposition system of claim 10, wherein said flow parameter comprises a mass flow rate, a molar flow rate, a number of moles, a mass, a mass fraction, a mole fraction, a partial pressure, or a concentration.

14. The deposition system of claim 10, further comprising:
a controller coupled to said process chamber, said vapor delivery system, said metal precursor evaporation system, and said flow measurement system, and configured to perform at least one of setting, monitoring, adjusting, or controlling one or more of a substrate temperature, an evaporation temperature, a vapor line temperature, a flow rate of said carrier gas, a flow rate of said metal precursor vapor, or a pressure in said process chamber.

15. The deposition system of claim 10, wherein said metal precursor evaporation system is configured to evaporate a solid metal precursor.

16. The deposition system of claim 10, wherein said metal precursor evaporation system is configured to evaporate a metal-carbonyl precursor.

17. The deposition system of claim 10, wherein said carrier gas supply system is configured to supply an inert gas.

18. The deposition system of claim 10, wherein said vapor precursor delivery system is characterized by a high conductance in excess of about 50 liters/second.

19. A deposition system for forming a refractory metal film on a substrate comprising:
a process chamber having a substrate holder configured to support said substrate and heat said substrate, a vapor distribution system configured to introduce a low vapor pressure metal precursor vapor above said substrate, and a pumping system configured to evacuate said process chamber;
a metal precursor evaporation system configured to evaporate a metal precursor;
a vapor delivery system having a high conductance gas line configured to flow the low vapor pressure metal precursor vapor, said high conductance gas line having a first end coupled to an outlet of said metal precursor evaporation system and a second end coupled to an inlet of said vapor distribution system of said process chamber;

a carrier gas supply system coupled to at least one of said metal precursor evaporation system or said vapor delivery system, or both, and configured to supply a carrier gas at a first flow to transport said low vapor pressure metal precursor vapor in said carrier gas through said high conductance gas line to said inlet of said vapor distribution system;

a flow measurement system including a reference gas line coupled between a reference gas source and an exhaust vent, and configured to supply a reference gas at a second flow through said reference gas line concurrently with said first flow to said exhaust vent to exhaust said second flow; and a single gas line extending between the vapor delivery system and the flow measurement system and having a differential pressure measurement system disposed therein, the single gas line forming the only fluidic connection between said vapor delivery system and said flow measurement system, said differential pressure measurement system configured to measure a flow parameter related to an amount of said low vapor pressure metal precursor vapor transported in said carrier gas by measuring a difference in pressure between said first flow of said carrier gas through said high conductance gas line and said second flow of said reference gas through said reference gas line, and said differential pressure measurement system being downstream of said metal precursor evaporation system.

20. The deposition system of claim 19, wherein the low vapor pressure metal precursor vapor is characterized by a vapor pressure of less than about 10 mTorr.

21. The deposition system of claim 1, wherein the differential pressure measurement system is configured to detect a difference in pressure not exceeding 1 Torr.

22. The deposition system of claim 1 further comprising:
a controller configured to receive said difference in pressure measurement and said absolute pressure measurement from said flow measurement system and to determine an amount of said metal precursor vapor in said first flow.

* * * * *